United States Patent
McClure

(10) Patent No.: US 6,496,439 B1
(45) Date of Patent: Dec. 17, 2002

(54) CONTENT ADDRESSABLE MEMORY (CAM) WITH BATTERY BACK-UP AND LOW CURRENT, STAND-BY MODE CONTROLLER

(75) Inventor: David C. McClure, Carrollton, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/895,491

(22) Filed: Jun. 29, 2001

(51) Int. Cl.[7] ................................................. G11C 5/14
(52) U.S. Cl. ..................... 365/229; 365/49; 365/227; 365/228; 365/226; 365/189.07; 365/189.09; 365/195; 365/51
(58) Field of Search ................... 365/49, 229, 228, 365/227, 226, 189.07, 189.09, 195, 51, 63

(56) References Cited

U.S. PATENT DOCUMENTS

| | | | |
|---|---|---|---|
| 3,575,617 A | * | 4/1971 | Burns .......................... 327/210 |
| 4,791,606 A | | 12/1988 | Threewitt et al. ............. 365/49 |
| 5,113,373 A | * | 5/1992 | Lee .............................. 365/227 |
| 5,383,146 A | | 1/1995 | Threewitt .................... 365/49 |
| 5,602,770 A | * | 2/1997 | Ohira ........................... 365/49 |
| 5,936,911 A | * | 8/1999 | Inaba .......................... 365/233 |
| 6,181,591 B1 | * | 1/2001 | Miyatake et al. ............. 365/49 |
| 6,201,753 B1 | | 3/2001 | Akaogi et al. ............... 365/226 |

* cited by examiner

Primary Examiner—Andrew Q. Tran
(74) Attorney, Agent, or Firm—Lisa K. Jorgenson; Andre Szuwalski

(57) ABSTRACT

A content addressable memory (CAM) includes a voltage power supply input and an enable input. An enable control circuit is connected to the enable input, and operates to compare an external voltage to an enable reference voltage. If the external voltage drops below the enable reference voltage, the enable control circuit drives the enable input to place the CAM into a low current, stand-by mode of operation. A voltage supply back-up circuit is connected to the voltage power supply input, and operates to compare the external voltage to a supply reference voltage. If the external voltage drops below the supply reference voltage, the voltage supply back-up circuit switches the voltage power supply input for the CAM from the external voltage input to a battery back-up. As an alternative, the voltage power supply input for the CAM includes a separate power input for a CAM array, and the switch causes only that separate power input for the CAM array to be powered from the battery back-up. The foregoing circuits are fabricated on an integrated circuit chip with the CAM. Alternatively, the CAM and the circuit may be fabricated on separate chips that share a common package.

39 Claims, 3 Drawing Sheets

CONTENT ADDRESSABLE MEMORY (CAM) WITH BATTERY BACK-UP AND LOW CURRENT, STAND-BY MODE CONTROLLER

BACKGROUND OF THE INVENTION

1. Technical Field of the Invention

The present invention relates to a content addressable memory (CAM) and, in particular, to a device for battery back-up protection of CAM stored data.

2. Description of Related Art

Content addressable memories (CAMs) are well known in the art. A CAM is a memory device in which data is stored in word locations comprising multiple memory cells, each cell storing a single bit of information. A search word in a comparand register of a CAM may be simultaneously compared with all stored data words. If a comparison for only a portion of a stored data word is desired, one or more mask registers may be used to prevent particular bits within the data word or words from taking part in the comparison with the search word. When a match occurs between the search word and one or more of the CAM stored data words, a match signal is generated. The address of the matching location within the CAM is then determined from the match signal and output. Thus, unlike the data accessing operation performed in a random access memory (RAM) where a user supplies an address to obtain stored data, a CAM-based device operates by having the user supply the data to obtain an address.

Not with standing this operational distinction between RAM-and CAM-based devices, these memory devices do share at least one important common operational feature—data volatility. If there is a power failure with respect to the applied voltage (Vcc) for either a RAM- or CAM-based device, the data stored by the device is irretrievably lost. In many system implementations where CAMs are utilized, this potential data loss presents a significant concern. For example, CAM-based devices are utilized in many communications switches/routers to store address translation tables. In the event of a power loss for the switch/router system that corrupts or destroys the stored data, the address tables must be re-built or recovered. This can be quite an involved and time consuming task.

There is accordingly a need for a circuit that functions to protect CAM-based device stored data in the event of a power disruption.

SUMMARY OF THE INVENTION

An external voltage is compared to an enable reference voltage. If the external voltage drops below the enable reference voltage, a content addressable memory (CAM) is placed into a low current, stand-by mode of operation. The external voltage is further compared to a supply reference voltage. If the external voltage drops below the supply reference voltage, the voltage power supply for the CAM is switched from external voltage input to a battery back-up.

In an alternative embodiment, the CAM includes a separate power input for a CAM array, and the switching action causes only that separate power input for the CAM array to be powered from the battery back-up.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
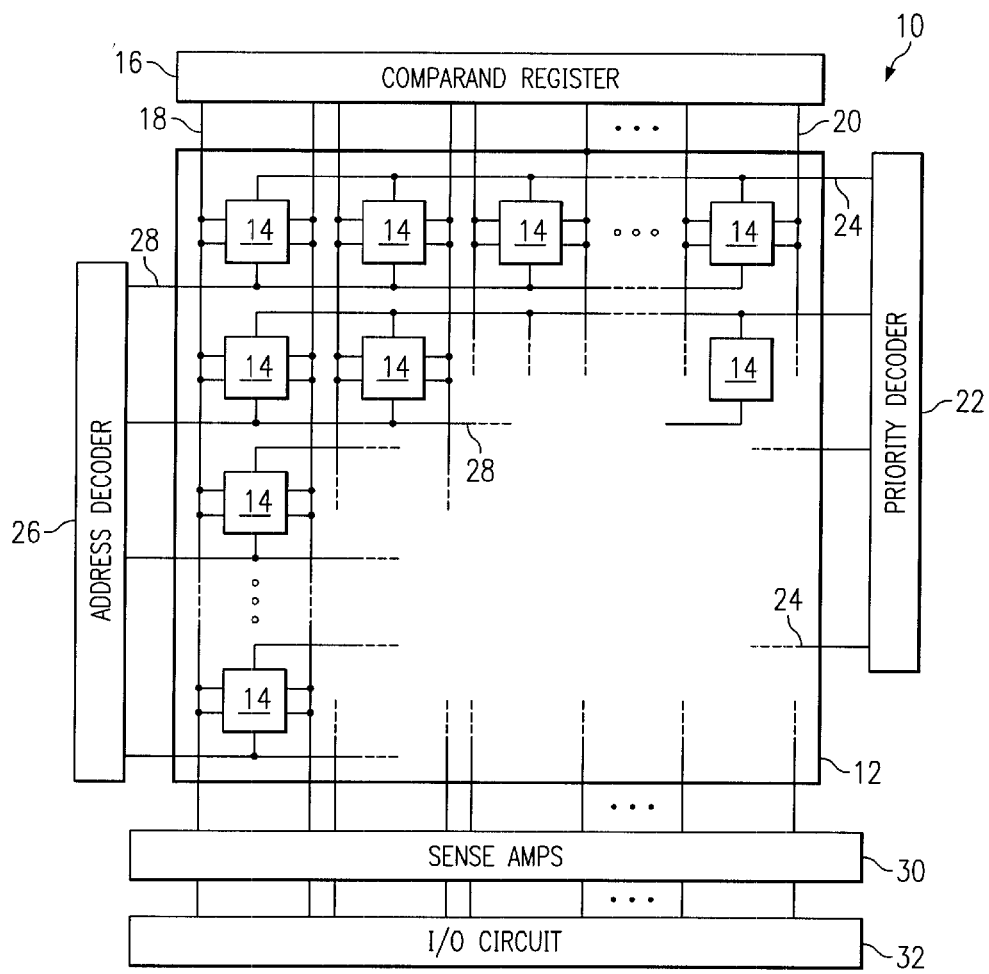
FIG. 1 is a block diagram of a content addressable memory (CAM) in accordance with the prior art.

Reference is now made to FIG. 1 wherein there is shown a block diagram of a content addressable memory 10 in accordance with the prior art. The memory 10 has a conventional architecture including a content addressable memory (CAM) array 12 that is formed from a plurality of CAM cells 14 arranged in rows and columns. Although not specifically illustrated, it is well known that each CAM cell 14 includes a random access memory (RAM) cell and a comparator. A comparand register 16 stores a search word for comparison with each data word that is row stored in the memory array 12. The comparand register 16 is connected to each CAM cell 14 in a column of the memory array 12 by a bit line 18 and an inverted bit line 20. When a comparison operation is performed, each bit in the comparand register 16 stored search word is simultaneously compared (by the comparators in each cell 14) to a corresponding bit in the relevant column of all row stored data words in the array 12.

Each row of CAM cells 14 is connected to a priority encoder 22 by a match line 24. In response to the performed comparison, each CAM cell 14 generates either a match signal on the match line 24 indicating a match between the search word bit and the data word bit, or a no-match signal on the match line 24 indicating a failure to match. The priority encoder 22 receives the match/no-match signal carried on each match line 24, and responsive to at least one match signal operates to compute the address of a highest priority one of the matching rows. This priority determination is normally based on criteria that has been previously programmed into the priority encoder 22.

Each row of CAM cells 14 is connected to an address decoder 26 by a word line 28. The address decoder 26 operates to assign an address to each data word as it is loaded into a row of the memory array 12. Application of an address to the array 12 by the address decoder 26 further facilitates address based (as opposed to content based) accessing of the data stored in rows of the memory array.

The memory 10 further includes a sense amp circuit 30 and input/output circuit 32 connected to the bit lines 18 and 20 and operable in a conventional, well known manner.

Figure 2:
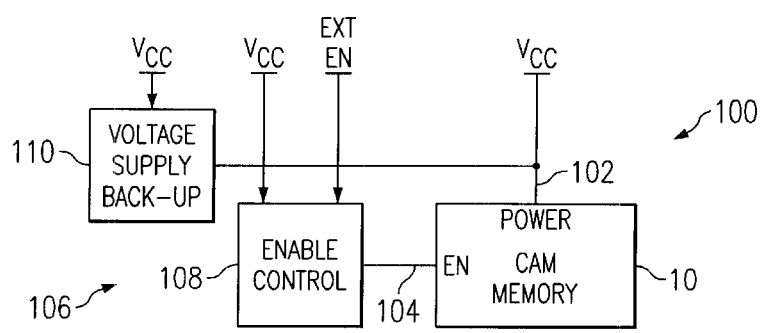
FIG. 2 is a block diagram of CAM circuit in accordance with an embodiment of the present invention.

Reference is now made to FIG. 2 wherein there is shown a block diagram of CAM circuit 100 in accordance with an embodiment of the present invention. The circuit 100 includes a CAM memory of any known configuration including, for example, a CAM memory 10 configuration like that shown in FIG. 1. The memory 10 includes a voltage power supply input 102 (which is generally connected to external Vcc) and an enable input 104. The voltage power supply input 102 provides the operating voltage for each circuit component of the CAM memory 10. Absent presence of a sufficient applied voltage to the input 102, the CAM memory 10 will not properly operate and further may irretrievably lose stored data. Through the enable input 104, an enable signal (EN) may be applied to control ability of the CAM memory 10 to perform read/write operations.

The circuit 100 further includes a non-volatile controller circuit 106 connected to both the voltage power supply input 102 and the enable input 104. The non-volatile controller circuit 106 includes an enable control sub-circuit 108 (connected to the enable input 104) and a voltage supply back-up sub-circuit 110 (connected to the voltage power supply input 102). The enable control sub-circuit 108 operates to compare a voltage (comprising external Vcc or indicative of external Vcc) to a first reference voltage. In response to a drop in that voltage below the first reference voltage, the sub-circuit 108 drives the enable input 104 to logic low. When disabled by this logic low signal, the CAM memory 10 is placed in a low current, stand-by mode of operation where the memory array (reference 12, FIG. 1) cannot be read-from, written-to, or otherwise disturbed. The voltage supply sub-circuit 110 operates to compare a voltage (comprising external Vcc or indicative of external Vcc) to a second reference voltage. In response to a drop in that voltage below the second reference voltage, the sub-circuit 110 switches CAM memory 10 power as applied to input 102 from external Vcc to a battery back-up.

Figure 3:
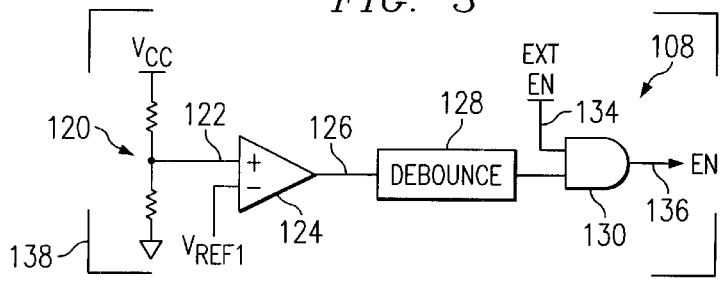
FIG. 3 is a block diagram of an embodiment for an enable control sub-circuit for the CAM circuit of FIG. 2.

Reference is now made to FIG. 3 wherein there is shown a block diagram of an embodiment for an enable control sub-circuit 108 in accordance with the present invention. A voltage divider 120 is connected between Vcc and ground. An output 122 of the divider (comprising a voltage indicative of external Vcc) is connected to a positive input (+) of a comparator 124. A negative input (−) of the comparator 124 receives a first reference voltage (Vref1) . When the voltage divider output 122 exceeds the first reference voltage, the comparator 124 outputs 126 a logic high signal that is passed through a debounce circuit 128 and applied to one input of a logic AND gate 130 where it is logically ANDed with an external enable signal (Ext EN) 134. When the external enable signal 134 and the comparator output 126 are both logic high, the AND gate 130 outputs 136 a logic high signal that is applied to the enable input 104. This applied logic high signal places the CAM memory 10 in its conventional, fully operational mode. Conversely, when the voltage divider output 122 does not exceed the first reference voltage, the comparator 124 outputs 126 a logic low signal that is passed through the debounce circuit 128 and applied to the logic AND gate 130 where it is logically ANDed with the external enable signal (Ext EN) 134. When either the external enable signal 134 or the comparator output 126 are logic low, the AND gate 130 outputs 136 a logic low signal that is applied to the enable input 104. This logic low signal places the CAM memory 10 in a low current, stand-by mode of operation where the memory array (reference 12, FIG. 1) cannot be read-from, written-to, or otherwise disturbed. It is recognized that the sub-circuit 108 may be fabricated either on an integrated circuit chip 138 or with discrete components, as desired.

Figure 4:
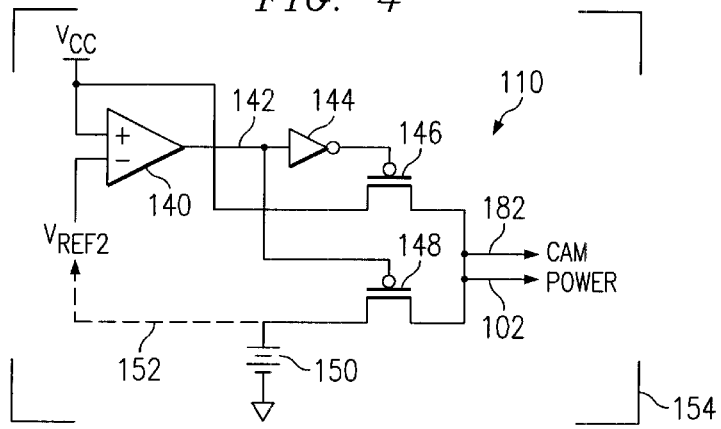
FIG. 4 is a block diagram of an embodiment for a voltage supply sub-circuit for the CAM circuit of FIG. 2.
Figure 7:
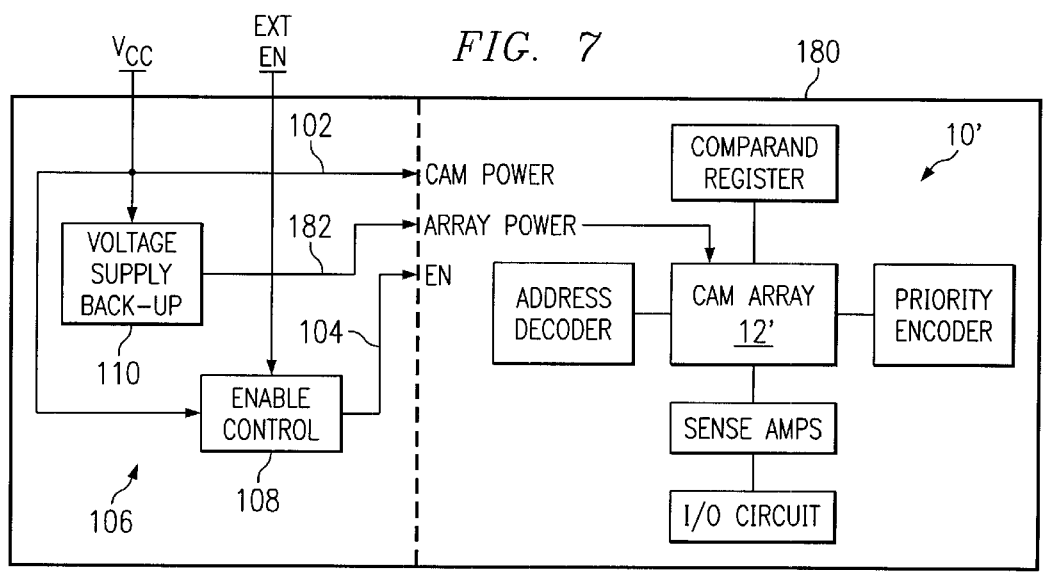
FIG. 7 is a block diagram of a content addressable memory (CAM) in accordance with an embodiment of the present invention.

Reference is now made to FIG. 4 wherein there is shown a block diagram of an embodiment for a voltage supply sub-circuit 110 in accordance with the present invention. A comparator 140 compares external Vcc (or perhaps a voltage indicative of external Vcc) to a second reference voltage (Vref2). When that voltage exceeds the second reference voltage, the comparator 140 outputs 142 a logic high signal that is inverted to a logic low signal by inverter 144 and applied to the gate terminal of a first p-channel FET 146. The logic high signal output 142 is applied to the gate of, and turns off, a second p-channel FET 148. A source terminal of the first FET 146 is connected to Vcc, and a drain terminal of that FET 146 is connected to the CAM memory 10 voltage power supply input 102 (or array power input 182 as shown in FIG. 7). When the logic low signal is applied to the first FET 146 gate terminal, the device turns on and passes Vcc to the CAM power input 102 (or array power input 182 as shown in FIG. 7). When that voltage drops and no longer exceeds the second reference voltage, the comparator 140 outputs 142 a logic low signal that is applied to the gate terminal of the second p-channel FET 148. The logic low signal output 142 is also inverted to a logic high signal by inverter 144 and applied to the gate terminal of, and turns off, the first p-channel FET 146. A source terminal of the second FET 148 is connected to a back-up battery 150, and a drain terminal of that FET 148 is connected to the CAM memory 10 voltage power supply input 102 (or array power input 182 as shown in FIG. 7). When the logic low signal is applied to the second FET 148 gate terminal, the device turns on and passes the battery 150 voltage to the CAM power input 102 (or array power input 182 as shown in FIG. 7). It is recognized that the sub-circuit 110 may be fabricated either on an integrated circuit chip 154 or with discrete components, as desired.

Combined reference is now made to FIGS. 3 and 4. The voltage levels for the first and second reference voltages are preferably set so that as Vcc drops the sub-circuit 108 triggers first and places the CAM memory 10 in a low current, stand-by mode of operation (by changing the enable signal 136). As Vcc continues to drop, the sub-circuit 110 triggers second and switches the CAM power input 102 (or array power input 182) from Vcc to the back-up battery 150. In a preferred embodiment, the second voltage reference may comprise the back-up battery voltage (as generally indicated at 152).

Figure 5:
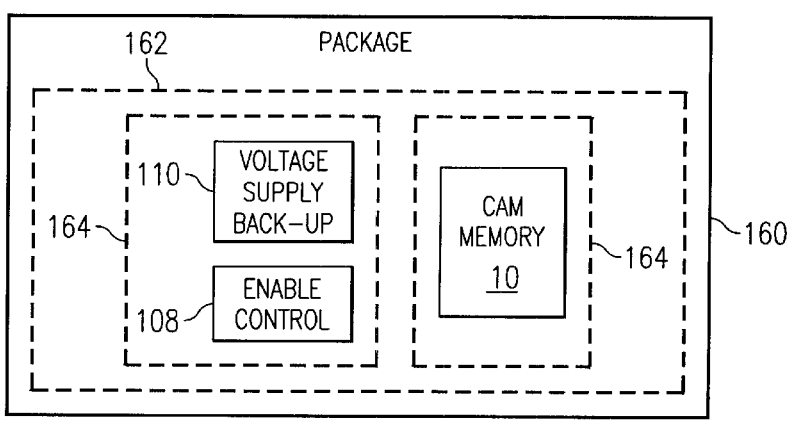
FIG. 5 is an embodiment of a semiconductor implementation of the CAM circuit of FIG. 2.

Reference is now made to FIG. 5 wherein there is shown an embodiment of a semiconductor implementation of the CAM circuit 100. In this implementation, a single semiconductor package 160 includes the circuitry for the CAM memory 10, the enable control sub-circuit 108 and the voltage supply back-up sub-circuit 110. This package 160 may have any suitable shape and pin-out configuration, and includes a single integrated circuit chip 162 containing the functionality and interconnections for all of the CAM memory 10, the enable control sub-circuit 108 and the voltage supply back-up sub-circuit 110. Alternatively, separate integrated circuit chips 164 for one or more of the CAM memory 10, the enable control sub-circuit 108 and the voltage supply back-up sub-circuit 110 could be included within a single package 160 (again, having any suitable shape and pin-out configuration). In this package implementation, appropriate interconnections (not explicitly shown) would be provided between the included chips 164 within the package 160.

Figure 6:
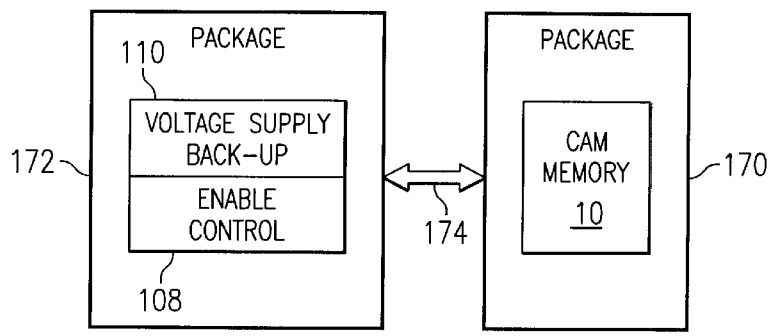
FIG. 6 is an embodiment of a semiconductor implementation of the sub-circuits of FIGS. 3 and 4.

Reference is now made to FIG. 6 wherein there is shown an embodiment of a semiconductor implementation of the sub-circuits of FIGS. 3 and 4. In this implementation, a first semiconductor package 170 (having any suitable shape and pinout configuration) includes the circuitry for the CAM memory 10, and a second semiconductor package 172 (having any suitable shape and pin-out configuration) includes the circuitry for the enable control sub-circuit 108 and the voltage supply back-up sub-circuit 110. These packages 170 and 172 are interconnected 174 with each other on the circuit board level. Within the package 172, a single integrated circuit chip containing the functionality and interconnections for all of the enable control sub-circuit 108 and the voltage supply back-up sub-circuit 110 may be provided. Alternatively, separate integrated circuit chips for each of the enable control sub-circuit 108 and the voltage supply back-up sub-circuit 110 could be included within the package 172. In this configuration, appropriate interconnections (not explicitly shown) would be provided between the included chips.

Reference is now made to FIG. 7 wherein there is shown a block diagram of a content addressable memory (CAM) integrated circuit 180 in accordance with an embodiment of the present invention. The integrated circuit 180 chip includes the functionality and interconnections for all of the CAM memory 10', the enable control sub-circuit 108 and the voltage supply back-up sub-circuit 110. In this embodiment, operation of the CAM memory 10' may be controlled through application of a memory enable (EN) signal to input 104 as discussed above. Power, generally speaking, for the CAM memory 10' is provided through application of a voltage (generally comprising Vcc) to the CAM power input 102. The CAM memory 10', however, differs from the prior art memory 10 (see, FIG. 1) in that the CAM array 12' has its own, separate array power input 182. Put another way, all components of the CAM memory 10' (except the CAM array 12') receive power from CAM power input 102 (much in the same manner as with the prior art memory 10), while the components of the CAM array 12' separately receive power from the array power input 182. The included enable control sub-circuit 108 and voltage supply back-up sub-circuit 110 operate in the same manner as described above in connection with the discussion of FIGS. 2, 3 and 4. However, one important difference is that the drain terminals of the FETs 146 and 148 are connected to the array power input 182 (see, FIG. 4) of the CAM array 12' instead of to the CAM power input 102 for the CAM memory 10 (see, FIG. 2). This configuration provides for improved performance of the non-volatile controller circuit 106. Load requirements of the included back-up battery 150 in this configuration are reduced due to the fact that it needs only supply power to CAM array 12' rather than the entire CAM memory 10 in the event of a Vcc power failure.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A content addressable memory (CAM) integrated circuit chip, comprising:
    a CAM array;
    a first power supply input connected to power the integrated circuit chip except for the CAM array;
    a second power supply input connected to power only the CAM array; and
    a voltage supply circuit connected to an off-chip voltage input and a back-up battery, the circuit operable to compare an external voltage applied to the off-chip voltage input to a supply reference voltage and, in response to a drop in the external voltage below the supply reference voltage, switch the second power supply input for the CAM array from the external voltage input to the back-up battery.

2. The integrated circuit as in claim 1 wherein the CAM array includes a plurality of memory cells, bit lines, address lines and match lines, the circuit further including:
    a comparand register connected to the bit lines;
    a priority encoder connected to the match lines; and
    an address decoder connected to the address lines;
    wherein the first power supply input is connected to power the comparand register, priority encoder and address decoder.

3. The integrated circuit as in claim 1 further including:
    an enable functionality operable to control access to the CAM array; and
    an enable control circuit connected to the external voltage and to the enable functionality, the circuit operable to compare a voltage indicative of the external voltage to an enable reference voltage, and in response to a drop in that voltage below the enable reference voltage, drive the enable functionality to inhibit read/write operations with respect to the CAM array.

4. The integrated circuit as in claim 1 wherein the supply reference voltage comprises a back-up battery output voltage.

5. A method for battery back-up operation of a content addressable memory (CAM), comprising the steps of:
    powering devices other than a CAM array within the CAM from a first power supply input;
    powering solely the CAM array of the CAM from a second power supply input;
    comparing an external voltage applied to the CAM to a supply reference voltage; and
    if the external voltage drops below the supply reference voltage, switching the second power supply input for the CAM array from the external voltage to a back-up battery.

6. The method as in claim 5 wherein the first power supply input is connected to the external voltage.

7. The method as in claim 5 wherein the supply reference voltage comprises a back-up battery output voltage.

8. The method as in claim 5 further including the steps of:
    comparing a voltage indicative of the external voltage to an enable reference voltage; and
    if the voltage indicative of the external voltage drops below the enable reference voltage, switching the CAM into a low current, stand-by mode of operation.

9. The method as in claim 8 wherein the step of switching comprises the step of controlling a CAM enable functionality to inhibit read/write operations with respect to the CAM array.

10. A non-volatile controller circuit for connection to a content addressable memory (CAM) having a voltage power supply input and an enable input, comprising:
    an enable control circuit having an external voltage input and operable to compare an external voltage to an enable reference voltage and drive the enable input to place the CAM into a low current, stand-by mode of operation if the external voltage drops below the enable reference voltage; and
    a voltage supply back-up circuit also having an external voltage input and operable to compare the external voltage to a supply reference voltage and switch the voltage power supply input for the CAM from the external voltage input to a battery back-up if the external voltage drops below the supply reference voltage.

11. The circuit as in claim 10 wherein the low current, stand-by mode of operation inhibits read/write operations with respect to a CAM array contained within the CAM.

12. The circuit as in claim 10 wherein the voltage power supply input for the CAM comprises a first supply input supplying power to a comparand register, a priority encoder and an address decoder of the CAM, and a second supply input supplying power to a CAM array of the CAM.

13. The circuit as in claim 12 wherein the voltage supply back-up circuit switches only the second supply input from the external voltage input to the battery back-up if the external voltage drops below the supply reference voltage.

14. The circuit as in claim 13 wherein the first supply input is connected to the external voltage input.

15. The circuit as in claim 10 wherein the supply reference voltage comprises a back-up battery output voltage.

16. The circuit as in claim 10 wherein the non-volatile controller circuit is fabricated on a single integrated circuit chip.

17. The circuit as in claim 10 wherein the non-volatile controller circuit is fabricated on a single integrated circuit chip along with the CAM.

18. The circuit as in claim 10 wherein the non-volatile controller circuit is packaged with the CAM in a single integrated circuit package.

19. The circuit as in claim 18 wherein the single integrated circuit package includes a first integrated circuit chip containing the non-volatile controller circuit and a second integrated circuit chip containing the CAM.

20. A method for battery back-up operation of a content addressable memory (CAM), comprising the steps of:
    powering the CAM from a power supply input;
    comparing an external voltage to a supply reference voltage; and
    if the external voltage drops below the supply reference voltage, switching the power supply input for the CAM from the external voltage to a back-up battery.

21. The method as in claim 20 wherein the step of powering the CAM comprises the steps of:
    powering a comparand register, a priority encoder and an address decoder of the CAM from a first power supply input; and
    powering a CAM array of the CAM from a second power supply input;
    wherein the first power supply input is connected to the external voltage; and
    wherein the step of switching comprises the step of switching only the second power supply input from the external voltage to the back-up battery.

22. The method as in claim 20 wherein the supply reference voltage comprises a back-up battery output voltage.

23. A method for controlling operation of a content addressable memory (CAM), comprising the steps of:
    powering the CAM from an external voltage;
    comparing a voltage indicative of the external voltage to an enable reference voltage; and
    if the voltage indicative of the external voltage drops below the enable reference voltage, switching the CAM into a low current, stand-by mode of operation.

24. The method as in claim 23 wherein the step of switching comprises the step of controlling a CAM enable functionality to inhibit read/write operations with respect to the CAM array.

25. A non-volatile controller circuit for connection to a content addressable memory (CAM) having a voltage power supply input, comprising:
    a voltage supply back-up circuit having:
        an external voltage input; and
        means for comparing an external voltage to a supply reference voltage; and
        means for switching the voltage power supply input for the CAM from the external voltage input to a battery back-up if the external voltage drops below the supply reference voltage.

26. The circuit as in claim 25 wherein the voltage power supply input for the CAM comprises a first supply input supplying power to a comparand register, a priority encoder and an address decoder of the CAM, and a second supply input supplying power to a CAM array of the CAM.

27. The circuit as in claim 26 wherein the means for switching switches only the second supply input from the external voltage input to the battery back-up if the external voltage drops below the supply reference voltage.

28. The circuit as in claim 27 wherein the first supply input is connected to the external voltage input.

29. The circuit as in claim 25 wherein the supply reference voltage comprises a back-up battery output voltage.

30. The circuit as in claim 25 wherein the non-volatile controller circuit is fabricated on a single integrated circuit chip.

31. The circuit as in claim 25 wherein the non-volatile controller circuit is fabricated on a single integrated circuit chip along with the CAM.

32. The circuit as in claim 25 wherein the non-volatile controller circuit is packaged with the CAM in a single integrated circuit package.

33. The circuit as in claim 32 wherein the single integrated circuit package includes a first integrated circuit chip containing the non-volatile controller circuit and a second integrated circuit chip containing the CAM.

34. A controller circuit for connection to a content addressable memory (CAM) having an enable input, comprising:
    an enable control circuit having:
        an external voltage input;
        means for comparing an external voltage to an enable reference voltage; and
        means for driving the enable input to place the CAM into a low current, stand-by mode of operation if the external voltage drops below the enable reference voltage.

35. The circuit as in claim 34 wherein the low current, stand-by mode of operation inhibits read/write operations with respect to a CAM array contained within the CAM.

36. The circuit as in claim 34 wherein the controller circuit is fabricated on a single integrated circuit chip.

37. The circuit as in claim 34 wherein the controller circuit is fabricated on a single integrated circuit chip along with the CAM.

38. The circuit as in claim 34 wherein the controller circuit is packaged with the CAM in a single integrated circuit package.

39. The circuit as in claim 38 wherein the single integrated circuit package includes a first integrated circuit chip containing the controller circuit and a second integrated circuit chip containing the CAM.

* * * * *